(12) United States Patent
Majetich et al.

(10) Patent No.: US 9,487,869 B2
(45) Date of Patent: Nov. 8, 2016

(54) PATTERN TRANSFER WITH SELF-ASSEMBLED NANOPARTICLE ASSEMBLIES

(71) Applicant: Carnegie Mellon University, Pittsburgh, PA (US)

(72) Inventors: Sara Majetich, Pittsburgh, PA (US); Tianlong Wen, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 832 days.

(21) Appl. No.: 13/907,716

(22) Filed: May 31, 2013

(65) Prior Publication Data

US 2013/0327636 A1    Dec. 12, 2013

Related U.S. Application Data

(60) Provisional application No. 61/689,241, filed on Jun. 1, 2012.

(51) Int. Cl.
| | |
|---|---|
| *C23F 1/04* | (2006.01) |
| *B05D 3/14* | (2006.01) |
| *G03F 7/00* | (2006.01) |
| *B82Y 40/00* | (2011.01) |

(52) U.S. Cl.
CPC ................. *C23F 1/04* (2013.01); *B05D 3/148* (2013.01); *G03F 7/0002* (2013.01); *B82Y 40/00* (2013.01); *Y10S 977/773* (2013.01); *Y10S 977/89* (2013.01); *Y10S 977/932* (2013.01)

(58) Field of Classification Search
CPC ....... B05D 3/148; C23F 1/04; G03F 7/0002; B82Y 40/00; Y10S 977/773; Y10S 977/89; Y10S 977/932
USPC ......................................... 216/58, 41, 42, 11
See application file for complete search history.

(56) References Cited

U.S. PATENT DOCUMENTS

| | | |
|---|---|---|
| 5,670,279 A | 9/1997 | Goldstein |
| 2009/0176015 A1* | 7/2009 | Nakanishi ............... C03C 15/00 427/162 |

* cited by examiner

*Primary Examiner* — Rodney McDonald
(74) *Attorney, Agent, or Firm* — Fish & Richardson P.C.

(57) ABSTRACT

In one aspect, a method comprises: providing a substrate having at least one layer in which the patterned dot array is to be fabricated; depositing a nanoparticle layer, wherein the nanoparticle layer comprises one or more surfactants and nanoparticles coated with the one or more surfactants; treating the one or more surfactants that coat the nanoparticles and the portions of the one or more surfactants that fill the spaces among the nanoparticles; removing the portions of the one or more surfactants that fill the spaces among the nanoparticles to expose portions of the at least one layer in which the patterned dot array is to be fabricated; etching the exposed portions of the at least one layer in which the patterned dot array is to be fabricated; and removing at least a portion of the nanoparticles.

29 Claims, 8 Drawing Sheets

PATTERN TRANSFER WITH SELF-ASSEMBLED NANOPARTICLE ASSEMBLIES

CLAIM OF PRIORITY

This application claims the benefit of priority under 35 U.S.C. §119(e) to provisional U.S. Patent Application No. 61/689,241, filed on Jun. 1, 2012, the entire contents of which are hereby incorporated by reference.

FIELD OF USE

The present disclosure relates generally to pattern transfer using a particle assembly as an etch mask, and specifically to pattern transfer using a self-assembled nanoparticle assembly as an etch mask.

BACKGROUND

Techniques to generate two-dimensional (2D) dense assemblies or periodic arrays with feature size of 20 nm or smaller in a substrate are in great demand for pattern miniaturization in applications such as bit patterned media, logic devices for information processing, nanosensors, and nanoplasmonics. Available techniques include electron beam (or e-beam) lithography and block copolymer lithography.

E-beam lithography uses a focused electron beam to fabricate individual nanoscale features on a resist, which is then developed and etched to transfer the pattern into a substrate. However, patterning a single magnetic hard disk may require about a week, and so this technology may have to be combined with nanoimprint technology to be economically viable. Achieving feature sizes less than 20 nm may be challenging due to forward scattering of electrons in the resist. Attaining high packing densities may also be difficult.

Alternatively, block copolymers self-assemble into polymer domains that can be combined with conventional lithography to make patterned arrays and then transferred into underlying substrates. However, there are stringent requirements on the energetics of surface and interface to control the morphologies of block copolymer self-assembly, making it increasingly difficult to scale to sizes below 20 nm. Mixtures of spherical, lamellar, and cylindrical (both perpendicular and parallel to the substrate) morphologies are often obtained.

SUMMARY

The present disclosure describes methods relating to fabricating patterned assemblies, such as periodic arrays, in a substrate. Many types of inorganic nanoparticles can be self-assembled into assemblies, and could therefore be used as templates for pattern transfer to make large area and high density two-dimensional (2D) assemblies, such as high density 2D periodic arrays. Large area patterned assemblies with feature size less than 20 nm can be fabricated quickly, reliably, and inexpensively. The density may be higher than densities that are feasible with electron beam or block copolymer lithography. The techniques described in this disclosure can be used to fabricate patterned assemblies, such as dot (pillar) arrays and antidot (pit or hole) arrays. The transferred nanopattern and feature size may be determined by the self-assembled monolayers of nanoparticles.

In one aspect of the present disclosure, a method for fabricating a dot array comprises: providing a substrate having at least one layer in which the patterned dot array is to be fabricated; depositing, onto the at least one layer in which the patterned dot array is to be fabricated, a nanoparticle layer, wherein the nanoparticle layer comprises one or more surfactants and nanoparticles coated with the one or more surfactants, and with portions of the one or more surfactants filling spaces among the nanoparticles in the nanoparticle layer; treating the one or more surfactants that coat the nanoparticles and the portions of the one or more surfactants that fill the spaces among the nanoparticles to stabilize positions of the nanoparticles on the at least one layer in which the patterned dot array is to be fabricated; removing, from the nanoparticle layer, the portions of the one or more surfactants that fill the spaces among the nanoparticles to expose portions of the at least one layer in which the patterned dot array is to be fabricated; etching the exposed portions of the at least one layer in which the patterned dot array is to be fabricated; and removing at least a portion of the nanoparticles.

Implementations of the disclosure can include one or more of the following features. The at least one layer in which the patterned dot array is to be fabricated comprises one of a single-layered or multi-layered film. The nanoparticles comprise self-assembled nanoparticles each having an average diameter of less than 20 nm. An average distance between each nanoparticle disposed on the layer is at least 2 nm. Treating the one or more surfactants that coat the nanoparticles and the portions of the one or more surfactants that fill the spaces among the nanoparticles comprises: irradiating the one or more surfactants using an electron beam to convert the one or more surfactant into hydrogenated amorphous carbon. Removing, from the at least one nanoparticle layer, the portions of the one or more surfactants that fill the spaces among the nanoparticles to expose portions of the at least one layer in which the patterned dot array is to be fabricated comprises: removing portions of the hydrogenated amorphous carbon that fill the spaces among the nanoparticles using low power directional oxygen plasma. The low power directional oxygen plasma has a power of 4 watts. Etching the exposed portions of the at least one layer comprises: etching the exposed portions of the layer using reactive ion etching. The reactive ion etching comprises carbon tetrafluoride-based reactive ion etching. The reactive ion etching comprises a methanol-based reactive ion etching. Removing at least a portion of the nanoparticles comprises: immersing the patterned dot array in an acid. The acid comprises at least one of aqua regia, hydrochloric acid, or phosphoric acid.

In another aspect of the present disclosure, a method for fabricating a patterned antidot array comprises: providing a substrate having at least one layer in which the patterned antidot array is to be fabricated; depositing, onto the at least one layer in which the patterned antidot array is to be fabricated, a nanoparticle layer, wherein the nanoparticle layer comprises one or more surfactants and nanoparticles coated with the one or more surfactants, with portions of the one or more surfactants filling spaces among the nanoparticles in the nanoparticle layer; treating the one or more surfactants that coat the nanoparticles and the portions of the one or more surfactants that fill the spaces among the nanoparticles to stabilize positions of the nanoparticles on the at least one layer in which the patterned antidot array is to be fabricated; removing at least a portion of the nanoparticles to expose portions of the at least one layer in which the patterned antidot array is to be fabricated; and etching the exposed portions of the at least one layer in which the patterned antidot array is to be fabricated.

Implementations of the disclosure can include one or more of the following features. The at least one layer in which the patterned dot array is to be fabricated comprises one of a single-layer or multi-layer film. The nanoparticles comprise self-assembled nanoparticles each having an average diameter of less than 20 nm. An average distance between each nanoparticle disposed on the layer is at least 2 nm. Treating the one or more surfactants that coat the nanoparticles and the portions of the one or more surfactants that fill the spaces among the nanoparticles comprises: irradiating the one or more surfactants using an electron beam to convert the surfactants into hydrogenated amorphous carbon. The method further includes, prior to removing, from the nanoparticle layer, at least a portion of the nanoparticles to expose portions of the at least one layer in which the patterned antidot array is to be fabricated, removing portions of the hydrogenated amorphous carbon that fill the spaces among the nanoparticles using low power directional oxygen plasma to expose other portions of the at least one layer, and depositing a fence material on the other portions of the at least one layer using electron beam evaporation in high vacuum; and after etching the exposed portions of the at least one layer in which the patterned dot array is to be fabricated, removing the fence material on the other portions of the at least one layer. The fence material comprises at least one of titanium, aluminum, chromium, or platinum. The fence material comprises chromium. The method further includes, after etching the exposed portions of the at least one layer in which the patterned antidot array is to be fabricated, removing the hydrogenated amorphous carbon using low power directional oxygen plasma. The low power directional oxygen plasma has a power of 4 watts. Removing the nanoparticles comprises: immersing the patterned antidot array in an acid. The acid comprises at least one of aqua regia, hydrochloric acid, or phosphoric acid. The acid comprises hydrochloric acid. Etching the exposed portions of the at least one layer in which the patterned dot array is to be fabricated comprises: etching the exposed portions of the at least one layer in which the patterned dot array is to be fabricated using reactive ion etching. The reactive ion etching comprises at least one of $CF_4$ RIE, $CHF_3$ RIE, or a combination of fluorine-based reactive ion etching. The reactive ion etching comprises a methanol-based reactive ion etching. The method further includes depositing a layer of gold film onto the antidot array, wherein the gold film segregates to fill holes of the antidot array to generate gold nanoparticle arrays.

The details of one or more implementations are set forth in the accompanying drawings and the description below. Other features, objects, and advantages will be apparent from the description, the drawings, and the claims.

DETAILED DESCRIPTION

Particle assemblies, such as particle arrays, can be used as an etch mask for patterning a substrate. Using a particle assembly as an etch mask, the pattern of the particle cores can be transferred into a substrate to fabricate an assembly, such as a dot array or an antidot array, in the substrate with a desired feature size. For example, a nanoparticle array can be used as an etch mask for high density parallel nanolithography to fabricate an array with a feature size less than 20 nm.

Figure 1:
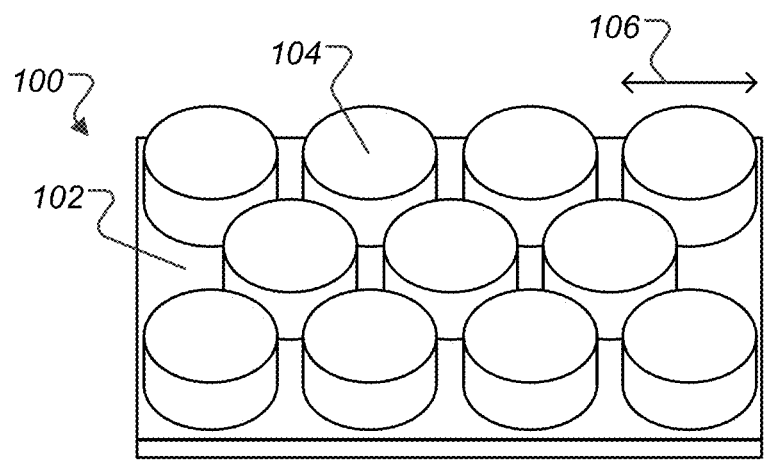
FIG. 1 shows an example of a dot array.

FIG. 1 shows an example of a dot (or pillar) array 100 fabricated in a substrate 102. The substrate 102 may be, for example, a silicon substrate or a silicon substrate coated with a thin film. The dot array 100 includes an array of features, such as pillars 104. The pillars 104 can be formed by positive patterning with particles, which forms pillars 104 where particles were positioned on the substrate.

The dot array 100 has a feature size 106, which refers to an approximate size of each feature. The feature size 106 may be measured from an edge of a pillar 104 to the opposite edge of the pillar 104. The feature size 106 may be a diameter or width of a pillar 104. The feature size and density are based on the particle size and spacing.

Figure 2:
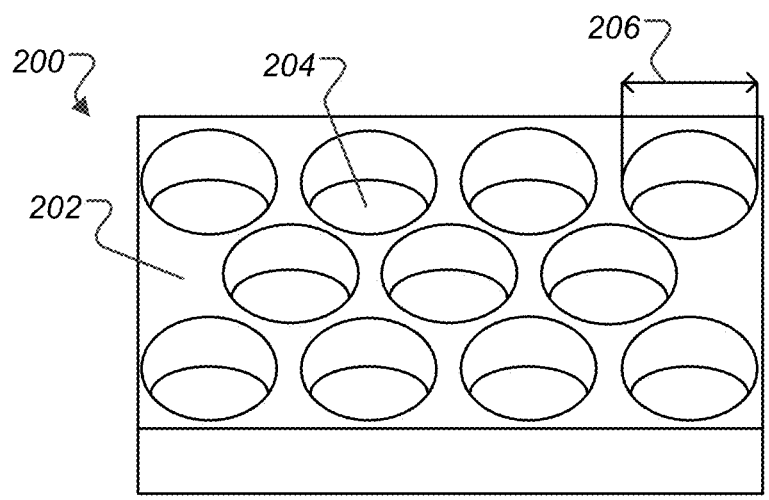
FIG. 2 shows an example of an antidot array.

FIG. 2 shows an example of an antidot (or pit or hole) array 200 fabricated in a substrate 202. The substrate 202 may be, for example, a silicon substrate or a silicon substrate coated with a thin film. The antidot array 200 includes an array of features, such as pits or holes 204. The holes 204 can be formed by negative patterning with particles, which forms holes 204 where particles were positioned on the substrate.

The antidot array 200 has a feature size 206, which refers to an approximate size of each feature. The feature size 206 may be measured from a side of a hole 104 to the opposite side of the hole 104. The feature size 206 may be a diameter or width of a hole 104. The feature size and density are based on the particle size and spacing. The center-to-center spacing, or pitch, of the holes 104 is the same as the spacing between the centers of the particles in the etch mask. The hole diameter is less than or equal to the original particle inorganic core diameter. For example, a dense hole array with 14 nm pitch and approximately 10 nm features may be obtained by using nanoparticles having 14 nm pitch and core diameters of approximately 12 nm. In some implementations, an antidot array in silicon may have a feature size less than 10 nm. With the smallest nanoparticles, such as platinum (Pt) or palladium (Pd) clusters, the feature size may be approximately 1 nm.

Figure 3:
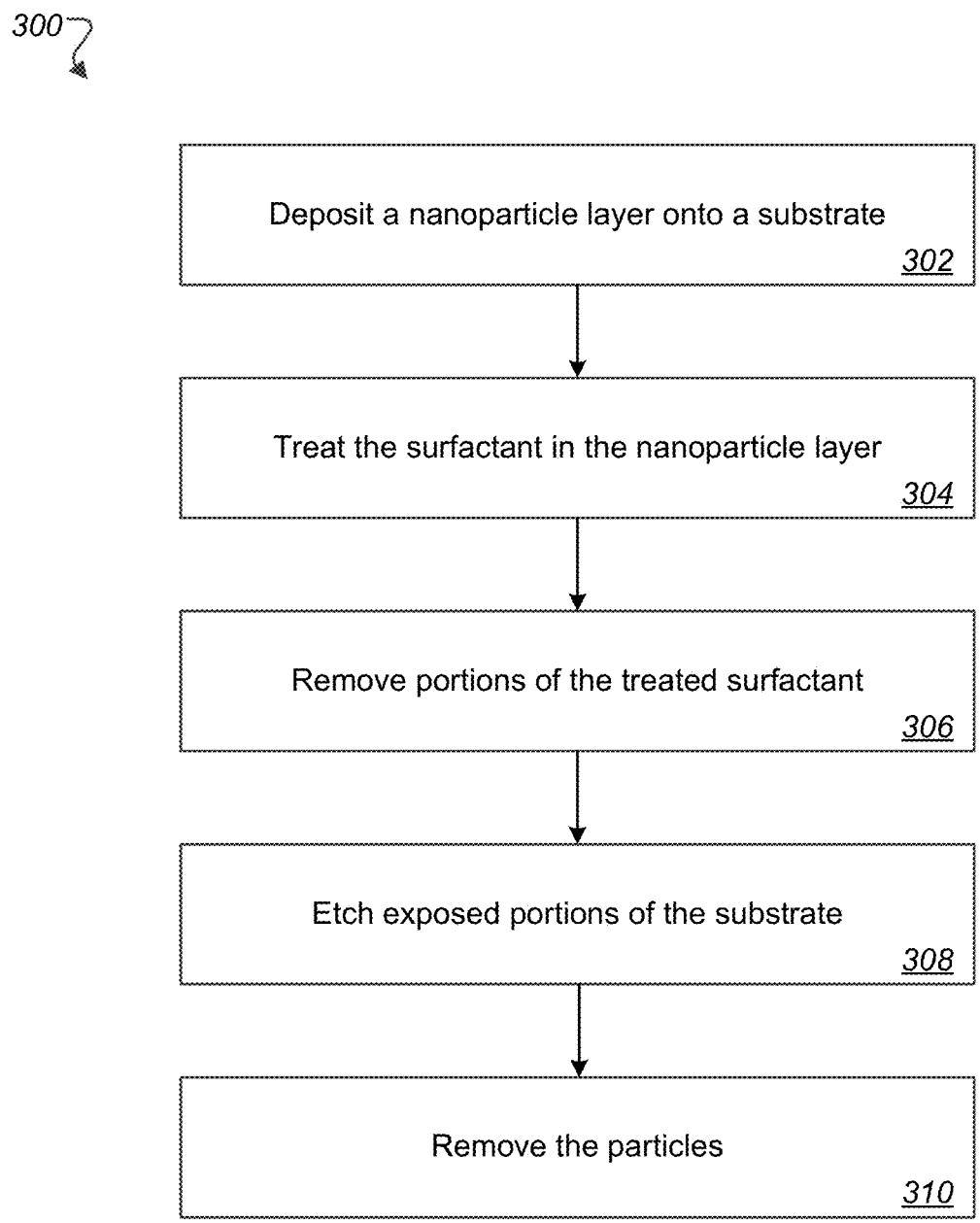
FIG. 3 is a flowchart of a process for fabricating a dot array.

FIG. 3 is a flowchart of a process 300 for fabricating a dot array. Briefly, the process 300 includes depositing a nanoparticle layer onto a substrate (302), treating the surfactant in the nanoparticle layer to fix the nanoparticles to the substrate (304), removing portions of the treated surfactant in the nanoparticle layer (306), etching exposed portions of the substrate (308), and removing the particles in the nanoparticle layer (310). The process 300 will now be described in more detail with reference to FIG. 4.

Figure 4:
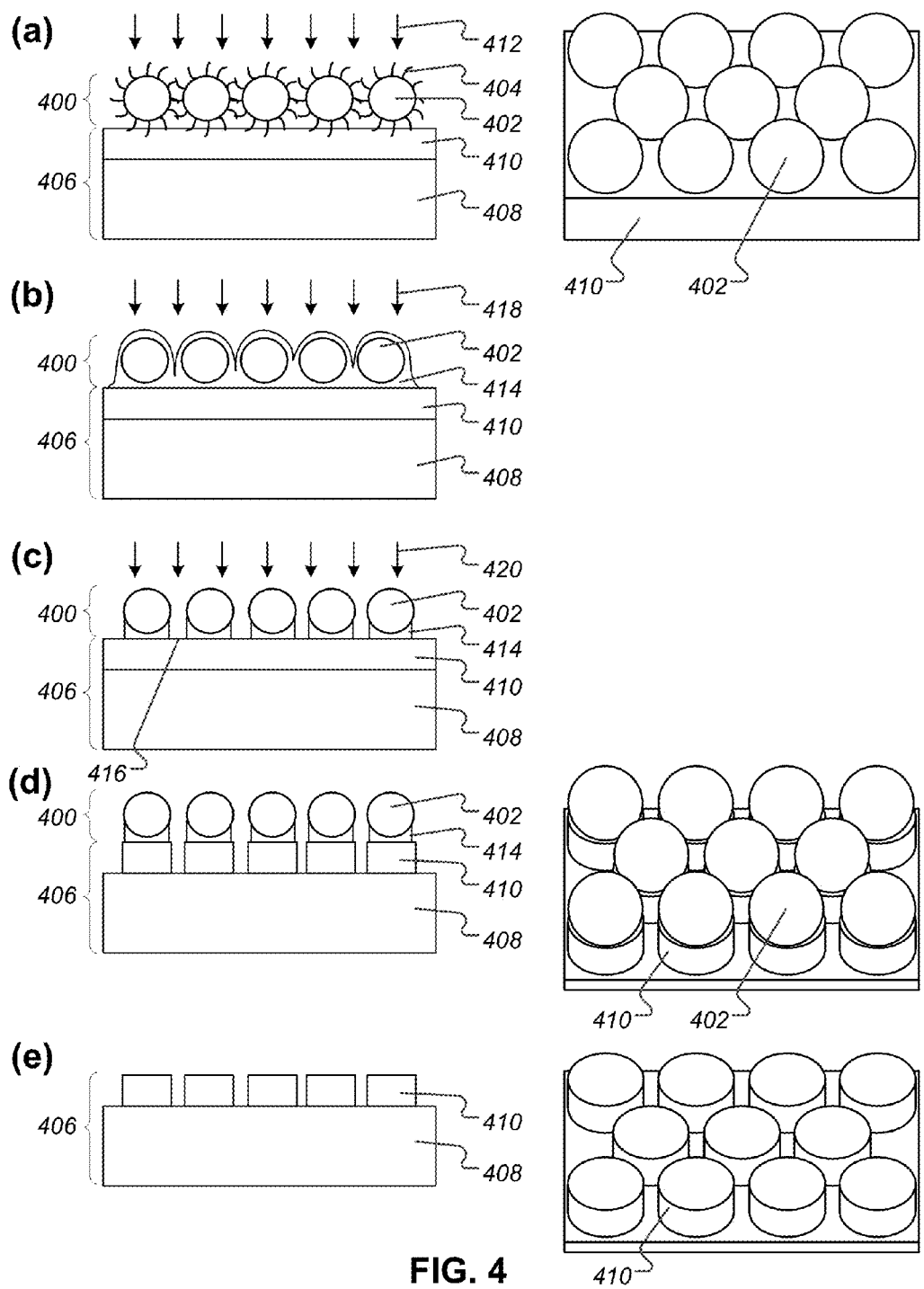
FIG. 4 shows side and perspective views of a dot array during different stages of fabrication using particles as an etch mask.

FIG. 4 shows side and perspective views of a dot array during different stages (a)-(e) of fabrication using particles as an etch mask. A particle layer 400 is deposited onto a substrate 406 as shown in stage (a). The particle layer 400 may include particles 402 coated with a surfactant 404. The particle layer 400 may include a continuous layer of surfactant 404 in which the particles 402 float. The particles 402 may be nanoparticles each having a diameter of less than 20 nm. The nanoparticles may be magnetite nanoparticles. The nanoparticles may include, for example, iron oxide ($Fe_3O_4$), manganese oxide (MnO), gold (Au), cadmium selenide (CdSe), silicon dioxide ($SiO_2$), or other suitable inorganic material, or a combination of materials. The nanoparticles 402 may be spaced apart from each other with portions of the surfactant 404 filling the spaces among the nanoparticles 402.

The substrate 406 may include a bulk substrate layer 408. The bulk substrate layer 408 may include, for example, silicon (Si). The substrate 406 may include a single-layer or multi-layer thin film 410 that is to be patterned. For example, the layer 410 may include one or more of silicon oxide ($SiO_x$), silicon nitride ($SiN_x$), iron-platinum (FePt), or a multilayer structure such as a tunnel junction. If the layer 410 includes a metallic thin film that is acid sensitive, the layer 410 may include a $SiO_x$ or $SiN_x$ layer that coats the acid sensitive metallic thin film, providing the metallic film with a sacrificial silicon oxide or nitride cap. With an epitaxial underlying film, the crystallographic orientation of each dot in the array can be well defined, which may be critical for some technologies such as magnetic recording and magnetoresistive logic devices.

The nanoparticles 402 are coated with the surfactant 404 to create a self-assembled nanoparticle array in the nanoparticle layer 400 as shown in the perspective view at stage (a). The surfactant 404 acts as a steric barrier between the nanoparticles 402 and prevents the nanoparticles 402 from aggregation through the balance of van der Waals attraction of the nanoparticles 402 and steric repulsion forces of the surfactant 404. The surfactant 404 may cause the nanoparticles 402 to be arranged such that a gap or space between the nanoparticles 402 is at least 2 nm. The size of the gap between the nanoparticles 402 is based on the steric repulsion forces of the surfactant 404.

In stage (a), the surfactant 404 is treated to stabilize positions of the nanoparticles 402 on the substrate 406. Treating the surfactant 404 maintains the steric barriers between the nanoparticles 402 and prevents crack formation in the nanoparticle array. If the steric barriers between nanoparticles 402 are not maintained, nanoparticles 402 may become mobile enough to move closer together and form cracks in the nanoparticle array. If the nanoparticles 402 are free to move, groups of nanoparticles 402 may aggregate into small islands separated by cracks, which may destroy the order or arrangement of the nanoparticle array. Cracking is the collective effect of these individual nanoparticle motions, and is a mechanism for relieving tensile stress.

The surfactant 404 may be treated using electron beam curing. During electron beam curing, the surfactant 404 is irradiated by electron beam 412. The electron beam 412 may have a diameter of approximately 3 cm and a beam intensity of approximately 8 $\mu A/cm^2$, with a tota dose to a treated region varying from approximately 5 to 50 $mC/cm^2$. For electron beam curing of large areas, substrate heating can be minimized by cycling the beam current, for example, by apply a beam current of approximately 8 $\mu cm^{-2}$ with a 1:4 on:off duty cycle.

The electrons 412 penetrate the surfactant 404 on the top, sides, and underneath the nanoparticles 402. Surfactant 404 underneath the nanoparticles 402 is more thoroughly cured near the gaps between the nanoparticles 402 than under the center of the nanoparticles 402 due to reduced attenuation of the electron beam 412 through the nanoparticles 402 at the thinner edge of the nanoparticles 402. Higher electron beam doses may induce further curing of the surfactant 404 underneath the nanoparticles 402.

Electron beam irradiation converts the surfactant 404 around the nanoparticles 402 into disordered carbon which may also contain some residual hydrogen. Electrons 412 cleave the chemical bonds of the surfactant 404 to form C—C cross-linkages between surfactant molecules with slowly depletion of hydrogen atoms. At the same time, the electron beam 412 promotes deposition of amorphous carbon. The resulting amorphous hydrogenated carbon 414 (also referred to as glassy carbon) (shown in stage (b)) produced underneath a nanoparticle 402 increases the strength of the interaction of the nanoparticle 402 with the substrate 406 and enables the nanoparticle 402 to adhere to the substrate 406. This fixes the pattern of the nanoparticle array and stabilizes the nanoparticle positions within the array.

In stage (b), the surfactant 404, particularly the glassy carbon 414, on top and between the nanoparticles 402 are removed to expose portions 416 (shown in stage (c)) of the substrate 406. A brief low power (e.g., 4 W) directional oxygen plasma 418 may be used to remove the glassy carbon 414 preferentially from the top and sides of the nanoparticles 402 while leaving a small amount underneath them that is needed for adhesion to the substrate 406.

In stage (c), the exposed portions 416 of the layer 410 are etched. The layer 410 underneath the nanoparticles 402 is preserved during etching, while the layer 410 originally underneath the removed glassy carbon 414 is etched away, producing the dot array in the layer 410. Reactive ion etching (RIE) may be used to etch away the exposed portions 416 of the layer 410 between the nanoparticles 402 to transfer the nanopattern of the nanoparticle array into the layer 410. In RIE, etchants 420 flow inward through the gaps between the nanoparticles 402, while etch products simultaneously flow outward. The gas phase species react with the exposed portions 416 and generate gas phase products that are pumped away, but do not significantly degrade the nanoparticles 402 or glassy carbon 414. For etching semiconductors and oxides, the RIE may be a fluorine-based plasma RIE such as $CF_4$ RIE, $CHF_3$ RIE, or a combination reactive ion etching (CF-RIE). For etching magnetic metals (e.g., Fe, Co, Ni), magnetic alloys (e.g., FePt or CoPt), or noble metals (e.g., Pt or Au), the RIE may be a methanol-based RIE (e.g., $CH_3OH$-RIE).

In stage (d), the nanoparticles 402 are removed. In some cases, portions of the nanoparticles 402 are removed, including, e.g., a range of 20% removal of the nanoparticles 402 to 99% removal of the nanoparticles 402. In other cases, the nanoparticles 402 are completely removed (i.e., 100% removal of the nanoparticles 402).

If the patterned layer 410 is acid resistant, the nanoparticles 402 may be removed by immersing the dot array in an acid, such as aqua regia, hydrochloric acid, phosphoric acid, or a mixture of acids. If the layer to be patterned is acid sensitive and has a sacrificial silicon oxide or nitride cap, the pattern of the inorganic nanoparticle cores is transferred into the silicon oxide or nitride cap. The particles may be removed with acid, leaving a hard mask of silicon oxide or nitride that has the same pattern as the nanoparticles. The mask is thinner in the regions where the nanoparticles 402 were originally positioned, and fluorine-based RIE will break through at these regions first, exposing the acid-sensitive metallic layer below. A brief dose of oxygen plasma may then be used to remove any remaining residual glassy carbon from the dot array.

A dot array may be used for magnetic hard disk drives or for magnetoresistive logic devices. For example, each dot of the dot array may be a thin film of ferromagnetic material that can be magnetized to record data on a hard disk. As another example, a dot may be a magnetic tunnel junction with a logic state that is read based on its electrical resistance, and written by applying a larger current or voltage pulse. In this case, the dot forms a unit of magnetic random access memory (MRAM). Other types of multilayer films patterned into dot arrays could be used for different kinds of random access memory, such as flash memory or ferroelectric memory.

Figure 5:
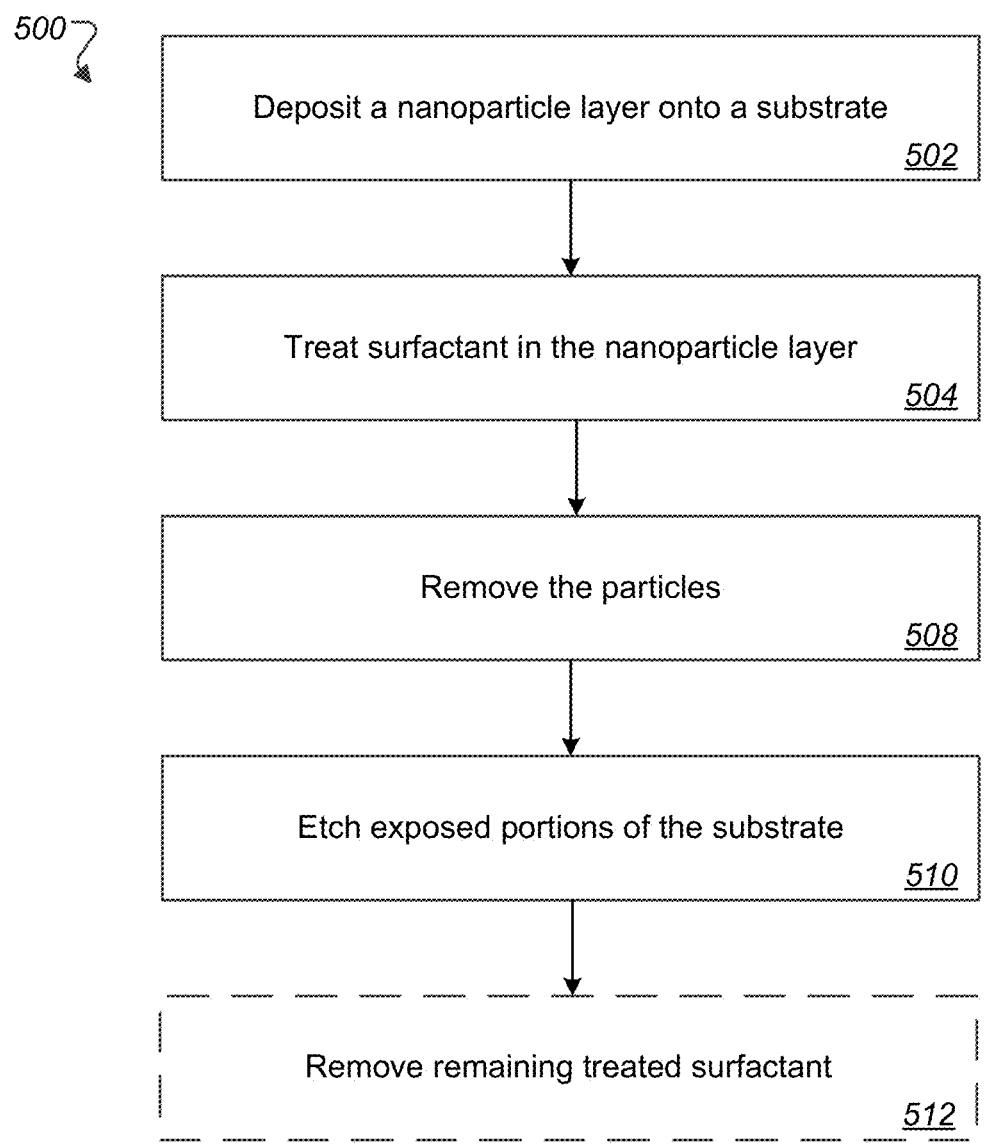
FIG. 5 is a flowchart of a process for fabricating an antidot array.

FIG. 5 is a flowchart of a process 500 for fabricating an antidot array. Briefly, the process 500 includes depositing a nanoparticle layer onto a substrate (502), treating the surfactant in the nanoparticle layer to fix the particles to the substrate (504), removing the particles in the nanoparticle layer (508), etching exposed portions of the substrate (510), and optionally removing remaining treated surfactant (512). The process 500 will now be described in more detail with reference to FIG. 6.

Figure 6:
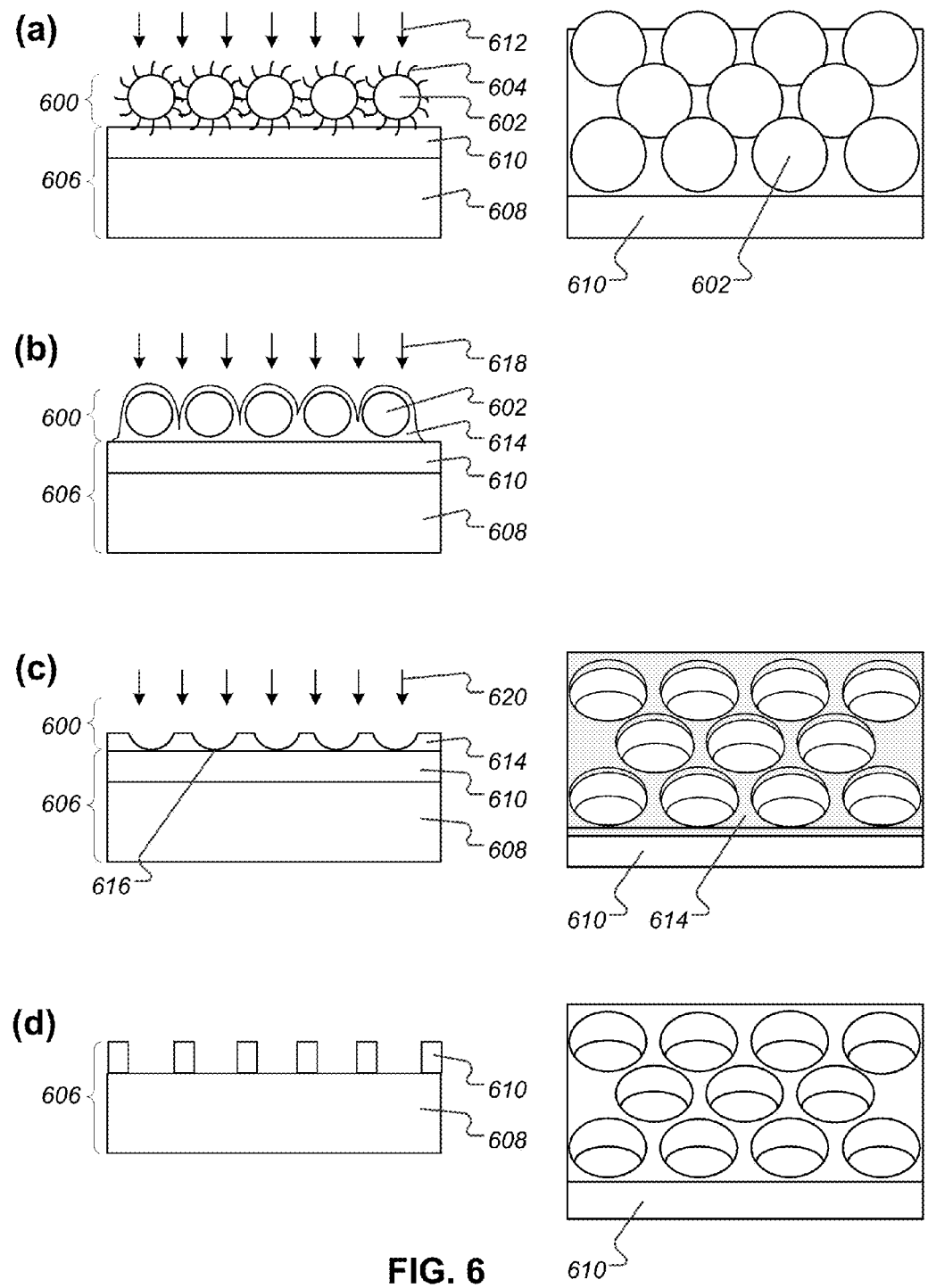
FIG. 6 shows side and perspective views of an antidot array during different stages of fabrication using hydrogenated amorphous carbon as an etch mask.

FIG. 6 shows side and perspective views of an antidot array during different stages (a)-(d) of fabrication using hydrogenated amorphous carbon as an etch mask. A particle layer 600 is deposited onto a substrate 606 as shown in stage (a). The particle layer 600 may include particles 602 coated with a surfactant 604. The particle layer 600 may include a continuous layer of surfactant 604 in which the particles 602 float. The particles 602 may be nanoparticles each having a diameter of less than 20 nm. The nanoparticles may be magnetite nanoparticles. The nanoparticles may include, for example, iron oxide ($Fe_3O_4$), manganese oxide (MnO), gold (Au), cadmium selenide (CdSe), silicon dioxide ($SiO_2$), or other suitable inorganic material, or a combination of materials. The nanoparticles 602 may be spaced apart from each other with portions of the surfactant 604 filling the spaces among the nanoparticles 602.

The substrate 606 may include a bulk substrate layer 608. The bulk substrate layer 608 may include, for example, silicon (Si). The substrate 606 may include a single-layer or multi-layer thin film 610 that is to be patterned. For example, the layer 610 may include one or more of silicon oxide ($SiO_x$), silicon nitride ($SiN_x$), iron-platinum (FePt), or a multilayer structure such as a tunnel junction.

The nanoparticles 602 are coated with the surfactant 604 to create a self-assembled nanoparticle array in the nanoparticle layer 600 as shown in the perspective view at stage (a). The surfactant 604 acts as a steric barrier between the nanoparticles 602 and prevents the nanoparticles 602 from aggregation through the balance of van der Waals attraction of the nanoparticles 602 and steric repulsion forces of the surfactant 604. The surfactant 604 may cause the nanoparticles 602 to be arranged such that a gap or space between the nanoparticles 602 is at least 2 nm. The size of the gap between the nanoparticles 402 is based on the steric repulsion forces of the surfactant 404.

In stage (a), the surfactant 604 is treated to harden the surfactant 604 and to stabilize positions of the nanoparticles 602 on the substrate 606. The surfactant 604 may be treated using electron beam curing. During electron beam curing, the surfactant 604 is irradiated by electron beam 612. The electron beam 612 may have a diameter of approximately 3 cm and a beam intensity of approximately 8 µA/cm², with a total dose to a treated region varying from approximately 5 to 50 mC/cm². For electron beam curing of large areas, substrate heating can be minimized by cycling the beam current, for example, by apply a beam current of approximately 8 µA cm$^{-2}$ with a 1:4 on:off duty cycle.

The electrons 612 penetrate the surfactant 604 on the top, sides, and underneath the nanoparticles 602. Surfactant 604 underneath the nanoparticles 602 is more thoroughly cured near the gaps between the nanoparticles 602 than under the center of the nanoparticles 602 due to reduced attenuation of the electron beam 612 through the nanoparticles 602 at the thinner edge of the nanoparticles 602. Higher electron beam doses may induce further curing of the surfactant 604 underneath the nanoparticles 602, producing a wider glassy carbon etch mask that can be used to fabricate an antidot array with smaller feature size.

Electron beam irradiation converts the surfactant 604 around the nanoparticles 602 into disordered carbon. Electrons 612 cleave the chemical bonds of the surfactant 604 to form C—C cross-linkages between surfactant molecules with slowly depletion of hydrogen atoms. At the same time, the electron beam 612 promotes deposition of amorphous carbon. The resulting amorphous hydrogenated carbon 614 (also referred to as glassy carbon) (shown in stage (b)) produced underneath a nanoparticle 602 increases the strength of the interaction of the nanoparticle 602 with the substrate 606 and enables the nanoparticle 602 to adhere to the substrate 606. This fixes the pattern of the nanoparticle array and stabilizes the nanoparticle positions within the array. The amorphous hydrogenated carbon 714 forms a mask material with great selectivity for deep etching into silicon or silicon oxide with carbon tetrafluoride ($CF_4$)-based reaction ion etching (RIE).

In stage (b), the nanoparticles 602 are removed. In some cases, portions of the nanoparticles 602 are removed, including, e.g., a range of 20% removal of the nanoparticles 602 to 99% removal of the nanoparticles 602. In other cases, the nanoparticles 602 are completely removed (i.e., 100% removal of the nanoparticles 602).

The nanoparticles 602 may be removed by immersing the array in an acid, such as aqua regia, hydrochloric acid, phosphoric acid, or a mixture of acids. For example, the array may be immersed into approximately 37% hydrochloric acid for 1 minute. Hydrochloric acid may not dissolve the well-cured surfactant 614 in the gaps between the nanoparticles 602, but will wash away moderate cured surfactant 614 underneath the nanoparticles 602 along with the nanoparticles 602. After the nanoparticles 602 are removed, the remaining glassy carbon 614 forms an etch mask (as shown in stage (c)) that can be used to fabricate the antidot array.

In stage (c), the exposed portions 616 of the layer 610 are etched to fabricate the antidot array of the layer 610 shown in stage (d). The layer 610 underneath the glassy carbon 614 is preserved during etching, while the layer 610 originally underneath the removed nanoparticles 602 are etched away, producing the antidot array in the layer 610. Reactive ion etching (RIE) may be used to etch away the exposed portions 616 of the layer 610 between the glassy carbon 614 to transfer the nanopattern of the glassy carbon 614 into the layer 610. In RIE, etchants 620 flow inward through the gaps between the glassy carbon 614, while etch products simultaneously flow outward. The gas phase species react with the exposed portions 616 and generate gas phase products that are pumped away. For etching semiconductors and oxides, the RIE may be a fluorine-based plasma RIE such a $CF_4$ RIE, $CHF_3$ RIE, or a combination reactive ion etching (CF-RIE). For etching magnetic metals (e.g., Fe, Co, Ni), magnetic alloys (e.g., FePt or CoPt), or noble metals (e.g., Pt or Au), the RIE may be a methanol-based RIE (e.g., CH₃OH-RIE). CF-RIE has a low etching rate of hydrogenated amorphous carbon and a high selectivity to silicon oxides ($SiO_x$), silicon nitrides ($SiN_x$), and silicon (e.g., Si). A brief dose of oxygen plasma may be used to remove any remaining residual glassy carbon from the antidot array.

Figure 7:
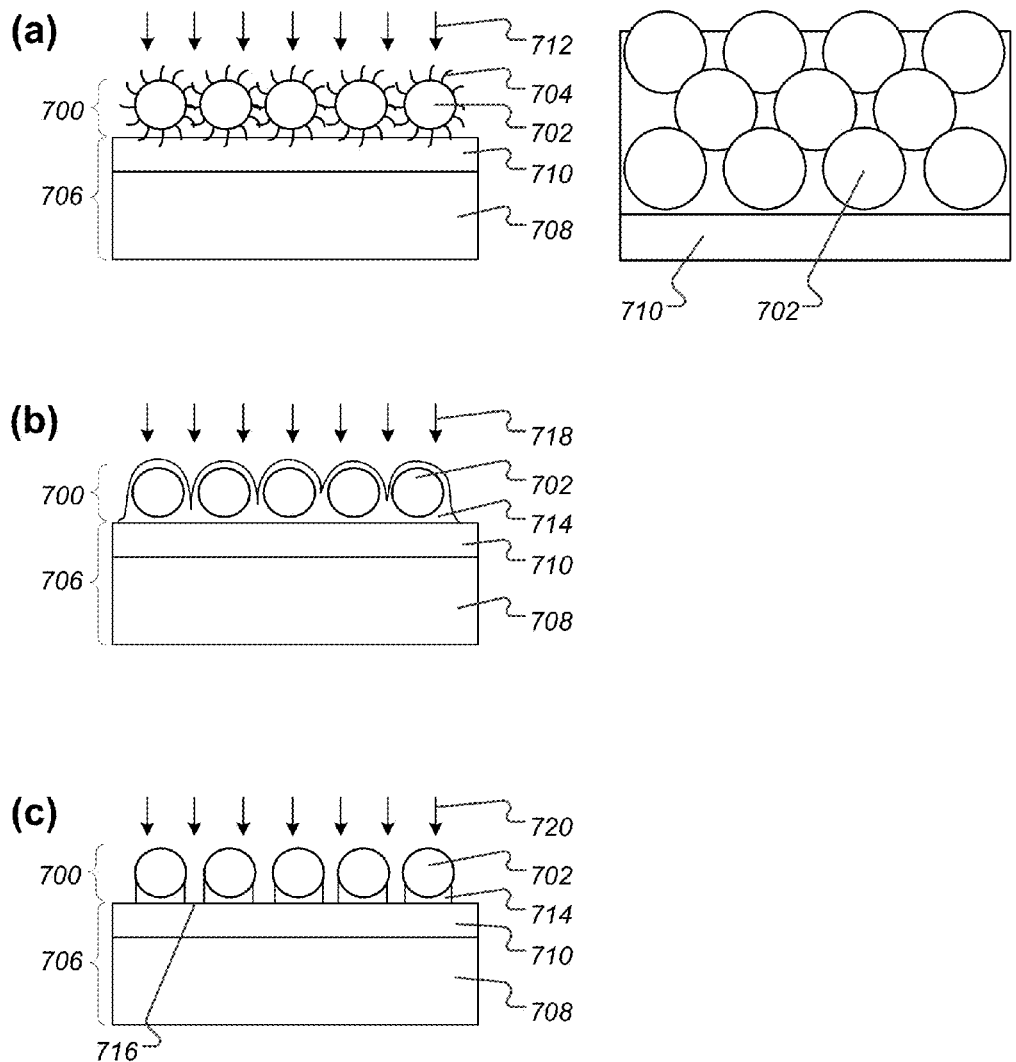
FIGS. 7 and 8 show side and perspective views of an antidot array during different stages of fabrication using deposition and liftoff
Figure 8:
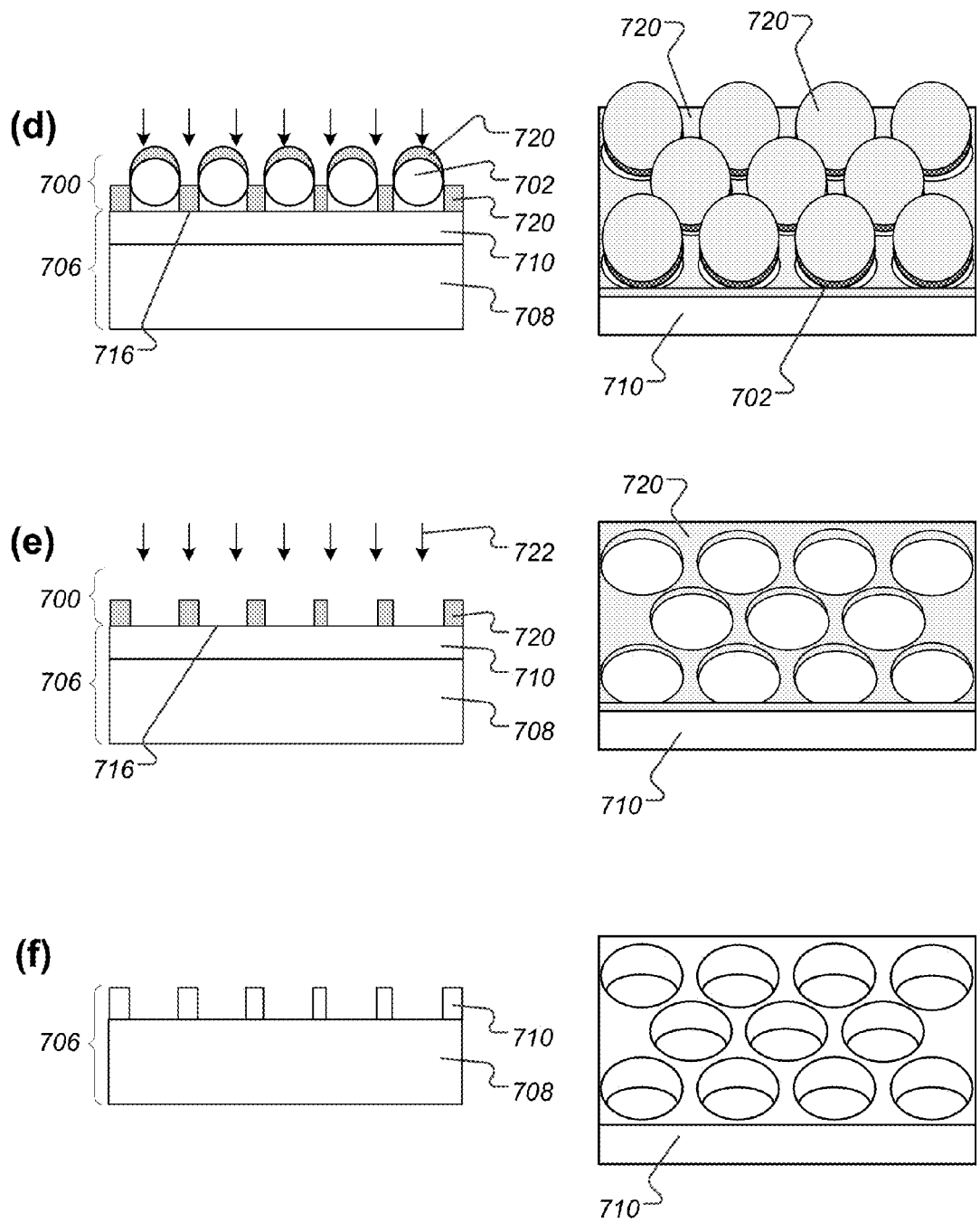

FIGS. 7 and 8 show side and perspective views of an antidot array formed using deposition and liftoff during different stages (a)-(f) of fabrication. A particle layer 700 is deposited on a substrate 706 as shown in stage (a). The particle layer 700 may include particles 702 coated with a surfactant 704. The particle layer 400 may include a continuous layer of surfactant 404 in which the particles 402 float. The particles 702 may be nanoparticles each having a diameter of less than 20 nm. The nanoparticles may include, for example, iron oxide ($Fe_3O_4$), manganese oxide (MnO), gold (Au), cadmium selenide (CdSe) silicon dioxide ($SiO_2$), or other suitable inorganic material, or a combination of materials. The nanoparticles 702 may be spaced apart from each other with portions of the surfactant 704 filling the spaces among the nanoparticles 702.

The substrate 706 may include a bulk substrate layer 708. The bulk substrate layer 708 may include, for example, silicon (Si). The substrate 706 may include a single-layer or multi-layer thin film 710 that is to be patterned. For example, the layer 710 may include one or more of silicon oxide ($SiO_x$), silicon nitride ($SiN_x$), iron-platinum (FePt), or a multilayer structure such as a tunnel junction If the layer 710 includes a metallic thin film that is acid sensitive, the layer 710 may include a $SiO_x$ or $SiN_x$ layer that coats the acid sensitive metallic thin film, providing the metallic film with a sacrificial silicon oxide or nitride cap.

The nanoparticles 702 are coated with the surfactant 704 to create a self-assembled nanoparticle array in the nanoparticle layer 700 as shown in the perspective view at stage (a). The surfactant 704 acts as a steric barrier between the nanoparticles 702 and prevents the nanoparticles 702 from aggregation through the balance of van der Waals attraction of the nanoparticles 702 and steric repulsion forces of the surfactant 704. The surfactant 704 may cause the nanoparticles 702 to be arranged such that a gap or space between the nanoparticles 702 is at least 2 nm. The size of the gap between the nanoparticles 402 is based on the steric repulsion forces of the surfactant 404.

In stage (a), the surfactant 704 is treated to stabilize positions of the nanoparticles 702 on the substrate 706. The surfactant 704 may be treated using electron beam curing. During electron beam curing, the surfactant 704 is irradiated by electron beam 712. The electron beam 712 may have a diameter of approximately 3 cm and a beam intensity of approximately 8 µA/cm², with a total dose for a given region varying from approximately 5 to 50 mC/cm². For electron beam curing of large areas, substrate heating can be minimized by cycling the beam current, for example, by apply a beam current of approximately 8 µA cm⁻² with a 1:4 on:off duty cycle.

The electrons 712 penetrate the surfactant 704 on the top, sides, and underneath the nanoparticles 702. Surfactant 704 underneath the nanoparticles 702 is more thoroughly cured near the gaps between the nanoparticles 702 than under the center of the nanoparticles 702 due to reduced attenuation of the electron beam 712 through the nanoparticles 702 at the thinner edge of the nanoparticles 702. Higher electron beam doses may induce further curing of the surfactant 604 underneath the nanoparticles 702.

Electron beam irradiation converts the surfactant 704 around the nanoparticles 702 into disordered carbon. Electrons 712 cleave the chemical bonds of the surfactant 704 to form C—C cross-linkages between surfactant molecules with slowly depletion of hydrogen atoms. At the same time, the electron beam 712 promotes deposition of amorphous carbon. The resulting amorphous hydrogenated carbon 714 (also referred to as glassy carbon) (shown in stage (b)) produced underneath a nanoparticle 702 increases the strength of the interaction of the nanoparticle 702 with the substrate 706 and enables the nanoparticle 702 to adhere to the substrate 706. This fixes the pattern of the nanoparticle array and stabilizes the nanoparticle positions within the array.

In stage (b), the surfactant 704, particularly the glassy carbon 714, on top and between the nanoparticles 702 are removed to expose portions 716 (shown in stage (c)) of the substrate 706. A brief low power (e.g., 4 W) directional oxygen plasma 718 may be used may be used to remove the glassy carbon 714 preferentially on the top and sides of the particles while leaving a small amount underneath the particles needed for adhesion to the substrate.

In stage (c), a thin overlayer or fence material 720 is deposited conformally onto the nanoparticle cores and in between the particles, as shown in stage (d). The fence material 720 may be deposited onto the nanoparticle array by electron beam evaporation in high vacuum. The fence material 720 may be, for example, titanium (Ti), aluminum (Al), chromium (Cr), platinum (Pt), or any other suitable metal or a combination of metals. The fence material 720 may have an empirical thickness of ⅙ of a nanoparticle diameter or less (e.g., a thickness of 1 to 2 nm).

In stage (d), the nanoparticles 702 are removed by liftoff. In some cases, portions of the nanoparticles 702 are removed, including, e.g., a range of 20% removal of the nanoparticles 702 to 99% removal of the nanoparticles 702. In other cases, the nanoparticles 702 are completely removed (i.e., 100% removal of the nanoparticles 702).

The nanoparticles 702 may be removed by immersing the array in an acid, such as aqua regia, hydrochloric acid, phosphoric acid, or a mixture of acids. The acid may be chosen based on the fence material 720. For example, aqua regia may be used to remove the nanoparticles 702 covered in titanium. Hydrochloric acid may be used to remove the nanoparticles 702 covered in platinum. Phosphoric acid may be used to remove the nanoparticles 702 covered in aluminum. After the nanoparticles 702 are removed, the remaining fence material 720 forms an etch mask (as shown in stage (e)) that can be used to fabricate the antidot array. Using fence material 720 as an etch mask may increase the aspect ratio of the antidot array in comparison to the aspect ratio of an antidot array fabricated using glassy carbon as an etch mask.

In stage (e), the exposed portions 716 of the layer 710 are etched to fabricate the array of the layer 710 shown in stage (f). The layer 710 underneath the fence material 720 is preserved during etching, while the layer 710 originally underneath the removed nanoparticles 702 are etched away, producing the antidot array in the layer 710. Reactive ion etching (RIE) may be used to etch away the exposed portions 716 of the layer 710 between the fence material 720 to transfer the nanopattern of the fence material 720 into the layer 710. In RIE, etchants 722 flow inward through the gaps between the fence material 720, while etch products simultaneously flow outward. The gas phase species react with the exposed portions 716 and generate gas phase products that are pumped away. The RIE may be a fluorine-based plasma RIE such as tetrafluoride-based reactive ion etching ($CF_4$RIE).

In stage (f), the fence material 720 is removed to fabricate the antidot array in layer 710. If the patterned layer 710 is acid resistant, the fence material 720 may be removed by immersing the dot array in an acid, such as aqua regia, hydrochloric acid, phosphoric acid, or a mixture of acids. While a short exposure is sufficient for liftoff of the fence material, a long exposure, or treatment with a stronger acid will dissolve the fence material. If the layer to be patterned is acid sensitive and has a sacrificial silicon oxide or nitride cap, the antidot array pattern is transferred into the silicon oxide or nitride cap. The fence material 720 may be removed with acid, leaving a hard mask of Si oxide or nitride that has the same antidot pattern. The mask is thinner in the regions where the particles were, and fluorine-based RIE will break through at these regions first, exposing the acid-sensitive metallic layer below. A brief dose of oxygen plasma may be used to remove any remaining residual glassy carbon from the antidot array.

An antidot array may be used as a template for fabricating an antidot array with larger sized gaps between holes. For example, an antidot array made from larger particles can be used as a template, and shallow holes are filled with smaller nanoparticles. The smaller nanoparticles go to the bottom of the shallow holes but do not fill them completely, so the gap between neighboring particles can be larger. The filled antidot array is then treated using the process described above to fabricate an antidot array with larger sized gaps between holes. This may alleviate aspect ratio-dependent etch rates that make pattern transfer challenging for small gaps. The ability to control the gap spacing could be important in optimizing the quality of pattern transfer, and reducing the number of defects in the patterns.

Figure 9:
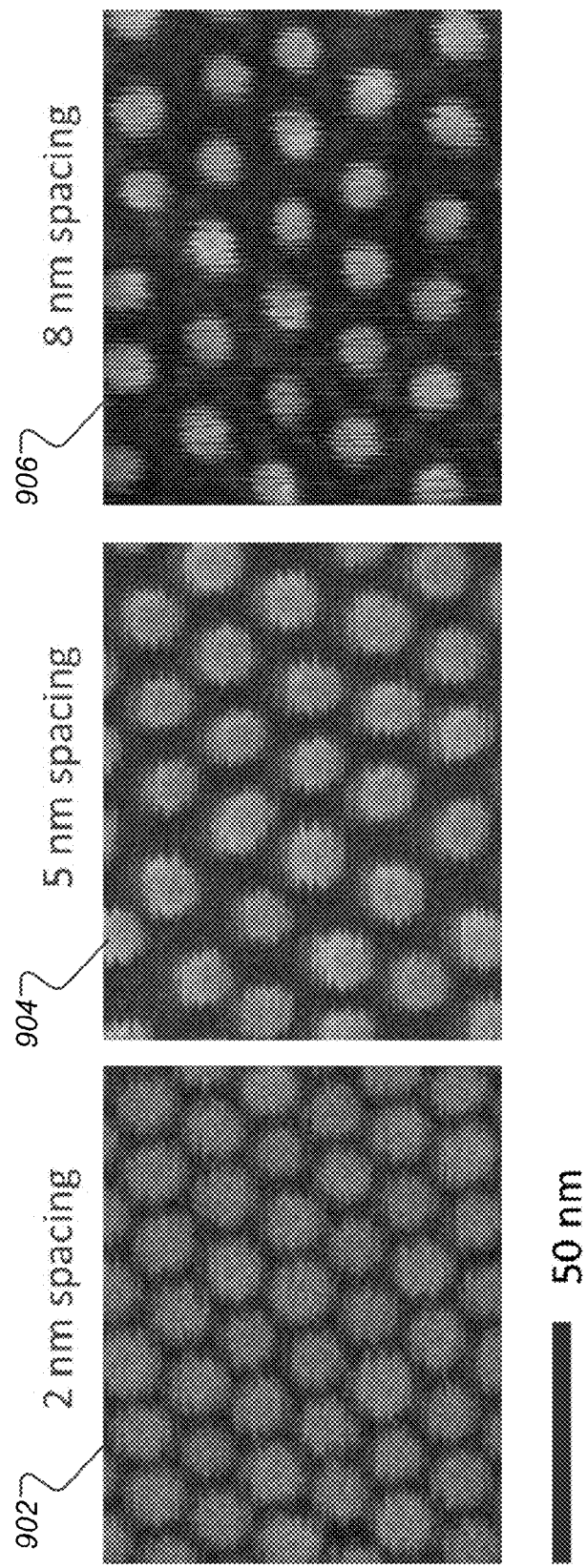
FIG. 9 shows examples of antidot arrays fabricated using antidot arrays as templates.

FIG. 9 shows examples of antidot arrays 904 and 906 fabricated using antidot arrays 902 and 904 as templates. Relatively large particles are used as a mask to fabricate the antidot array 902 having approximately 2 nm sized gaps (dark areas) between shallow holes (light circles). Slightly smaller particles are then inserted into the shallow holes of the antidot array 902, and the antidot array 902 is treated to fabricate the antidot array 904 having larger sized gaps (dark areas) of approximately 5 nm between holes (light circles). Even smaller particles are then inserted into the holes of the antidot array 904, and the antidot array is treated to fabricate the antidot array 906 having even larger sized gaps (dark areas) of approximately 8 nm between holes (light circles).

An antidot array may be used for plasmonic applications, or in the controlled growth of nanowire or carbon nanotube arrays. For example, a thin layer of gold film (e.g., approximately 1 nm) may be deposited onto an antidot array of silicon oxide. The antidot array may have a pitch size (center-to-center distance) of approximately 15 nm and a feature diameter of approximately 10 nm. After gold deposition, the gold film preferentially fills the holes to generate gold nanoparticle arrays. When deposited gold segregates to fill the holes, both the gold surface area and the gold and silicon oxide interface shrinks to minimize the total free energy. The gold nanoparticles have a pitch size of approximately 15 nm and a diameter of approximately 4 nm. To increase feature size, thickness of the deposited gold film may be increased. By controlling the thickness of the deposited gold film, gold nanoparticle arrays with different feature sizes but the same pitch size can be obtained. These patterned gold nanoparticles are stable without the aid of surfactants or surface ions, in contrast to their chemically prepared counterparts. Such gold nanoparticle arrays may be used as seed nanoparticles for vapor-liquid-solid nanowire growth to generate high density semiconducting nanowire or carbon nanotube arrays with controlled interwire separation.

A number of implementations have been described. Nevertheless, various modifications can be made without departing from the spirit and scope of the processes and techniques described herein. In addition, the processes depicted in the figures do not require the particular order shown, or sequential order, to achieve desirable results. In addition, other steps can be provided, or steps can be eliminated, from the described processes, and other components can be added to, or removed from, the describe apparatus and systems. Accordingly, other embodiments are within the scope of the following claims.

What is claimed is:

1. A method for fabricating a patterned dot array, the method comprising:
   providing a substrate having at least one layer in which the patterned dot array is to be fabricated;
   depositing, onto the at least one layer in which the patterned dot array is to be fabricated, a nanoparticle layer, wherein the nanoparticle layer comprises one or more surfactants and nanoparticles, with the nanoparticles being coated with the one or more surfactants in the nanoparticle layer, and with portions of the one or more surfactants filling spaces among the nanoparticles in the nanoparticle layer;
   treating the one or more surfactants that coat the nanoparticles and the portions of the one or more surfactants that fill the spaces among the nanoparticles to stabilize positions of the nanoparticles on the at least one layer in which the patterned dot array is to be fabricated;
   removing, from the nanoparticle layer, the portions of the one or more surfactants that fill the spaces among the nanoparticles to expose portions of the at least one layer in which the patterned dot array is to be fabricated;
   etching the exposed portions of the at least one layer in which the patterned dot array is to be fabricated; and
   removing at least a portion of the nanoparticles.

2. The method of claim 1, wherein the at least one layer in which the patterned dot array is to be fabricated comprises one of a single-layered or multi-layered film.

3. The method of claim 1, wherein the nanoparticles comprise self-assembled nanoparticles each having an average diameter of less than 20 nm.

4. The method of claim 1, wherein an average distance between each nanoparticle disposed on the layer is at least 2 nm.

5. The method of claim 1, wherein treating the one or more surfactants that coat the nanoparticles and the portions of the one or more surfactants that fill the spaces among the nanoparticles comprises:
   irradiating the one or more surfactants using an electron beam to convert the one or more surfactant into hydrogenated amorphous carbon.

6. The method of claim 5, wherein removing, from the at least one nanoparticle layer, the portions of the one or more surfactants that fill the spaces among the nanoparticles to expose portions of the at least one layer in which the patterned dot array is to be fabricated comprises:
   removing portions of the hydrogenated amorphous carbon that fill the spaces among the nanoparticles using low power directional oxygen plasma.

7. The method of claim 6, wherein the low power directional oxygen plasma has a power of 4 watts.

8. The method of claim 1, wherein etching the exposed portions of the at least one layer comprises:

etching the exposed portions of the layer using reactive ion etching.

9. The method of claim 8, wherein the reactive ion etching comprises carbon tetrafluoride-based reactive ion etching.

10. The method of claim 8, wherein the reactive ion etching comprises a methanol-based reactive ion etching.

11. The method of claim 1, wherein removing at least a portion of the nanoparticles comprises:
immersing the patterned dot array in an acid.

12. The method of claim 11, wherein the acid comprises at least one of aqua regia, hydrochloric acid, or phosphoric acid.

13. A method for fabricating a patterned antidot array, the method comprising:
providing a substrate having at least one layer in which the patterned antidot array is to be fabricated;
depositing, onto the at least one layer in which the patterned antidot array is to be fabricated, a nanoparticle layer, wherein the nanoparticle layer comprises one or more surfactants and nanoparticles, with the nanoparticles being coated with the one or more surfactants in the nanoparticle layer, with portions of the one or more surfactants filling spaces among the nanoparticles in the nanoparticle layer;
treating the one or more surfactants that coat the nanoparticles and the portions of the one or more surfactants that fill the spaces among the nanoparticles to stabilize positions of the nanoparticles on the at least one layer in which the patterned antidot array is to be fabricated;
removing at least a portion of the nanoparticles to expose portions of the at least one layer in which the patterned antidot array is to be fabricated; and
etching the exposed portions of the at least one layer in which the patterned antidot array is to be fabricated.

14. The method of claim 13, wherein the at least one layer in which the patterned dot array is to be fabricated comprises one of a single-layer or multi-layer film.

15. The method of claim 13, wherein the nanoparticles comprise self-assembled nanoparticles each having an average diameter of less than 20 nm.

16. The method of claim 13, wherein an average distance between each nanoparticle disposed on the layer is at least 2 nm.

17. The method of claim 13, wherein treating the one or more surfactants that coat the nanoparticles and the portions of the one or more surfactants that fill the spaces among the nanoparticles comprises:
irradiating the one or more surfactants using an electron beam to convert the surfactants into hydrogenated amorphous carbon.

18. The method of claim 17, further comprising:
prior to removing, from the nanoparticle layer, at least a portion of the nanoparticles to expose portions of the at least one layer in which the patterned antidot array is to be fabricated,
removing portions of the hydrogenated amorphous carbon that fill the spaces among the nanoparticles using low power directional oxygen plasma to expose other portions of the at least one layer, and
depositing a fence material on the other portions of the at least one layer using electron beam evaporation in high vacuum; and
after etching the exposed portions of the at least one layer in which the patterned dot array is to be fabricated, removing the fence material on the other portions of the at least one layer.

19. The method of claim 18, wherein the fence material comprises at least one of titanium, aluminum, chromium, or platinum.

20. The method of claim 19, wherein the fence material comprises chromium.

21. The method of claim 17, further comprising:
after etching the exposed portions of the at least one layer in which the patterned antidot array is to be fabricated, removing the hydrogenated amorphous carbon using low power directional oxygen plasma.

22. The method of claim 21, wherein the low power directional oxygen plasma has a power of 4 watts.

23. The method of claim 13, wherein removing the nanoparticles comprises:
immersing the patterned antidot array in an acid.

24. The method of claim 23, wherein the acid comprises at least one of aqua regia, hydrochloric acid, or phosphoric acid.

25. The method of claim 24, wherein the acid comprises hydrochloric acid.

26. The method of claim 13, wherein etching the exposed portions of the at least one layer in which the patterned antidot array is to be fabricated comprises:
etching the exposed portions of the at least one layer in which the patterned antidot array is to be fabricated using reactive ion etching.

27. The method of claim 26, wherein the reactive ion etching comprises at least one of $CF_4$ RIE, $CHF_3$ RIE, or a combination of fluorine-based reactive ion etching.

28. The method of claim 26, wherein the reactive ion etching comprises a methanol-based reactive ion etching.

29. The method of claim 13, further comprising:
depositing a layer of gold film onto the antidot array, wherein the gold film segregates to fill holes of the antidot array to generate gold nanoparticle arrays.

* * * * *

UNITED STATES PATENT AND TRADEMARK OFFICE
CERTIFICATE OF CORRECTION

| | | Page 1 of 1 |
|---|---|---|
| PATENT NO. | : 9,487,869 B2 | |
| APPLICATION NO. | : 13/907716 | |
| DATED | : November 8, 2016 | |
| INVENTOR(S) | : Sara Majetich and Tianlong Wen | |

It is certified that error appears in the above-identified patent and that said Letters Patent is hereby corrected as shown below:

In the Specification

Column 1, Line 12 add -- STATEMENT REGARDING FEDERALLY SPONSORED RESEARCH
This invention was made with United States government support under 0925926, 0804779, and 0507050 awarded by the National Science Foundation. The U.S. government has certain rights in the invention. --

Signed and Sealed this
Twelfth Day of August, 2025

Coke Morgan Stewart
*Acting Director of the United States Patent and Trademark Office*